(12) United States Patent
Hu

(10) Patent No.: US 6,435,409 B1
(45) Date of Patent: Aug. 20, 2002

(54) CARD READER STRUCTURE WITH AN AXIAL-ROTATE JOINT

(76) Inventor: Kuang-Hua Hu, P. O Box No. 6-57, Chung-Ho City, Taipei Hsien 235 (TW)

(*) Notice: Subject to any disclaimer, the term of this patent is extended or adjusted under 35 U.S.C. 154(b) by 0 days.

(21) Appl. No.: 09/814,741

(22) Filed: Mar. 23, 2001

(51) Int. Cl.[7] .................. G06K 07/00; G06K 07/06
(52) U.S. Cl. .................. 235/441; 235/486; 439/630
(58) Field of Search ..................... 235/441, 492, 235/380, 474, 475, 476–479, 486, 487; 705/64; 439/630, 64, 946; 361/737, 66, 792

(56) References Cited

U.S. PATENT DOCUMENTS

| | | | | |
|---|---|---|---|---|
| 5,231,274 A | * | 7/1993 | Reynier | 235/441 |
| 5,265,951 A | * | 11/1993 | Kumar | 312/223.2 |
| 5,894,120 A | * | 4/1999 | Arase et al. | 235/432 |
| 5,973,799 A | * | 10/1999 | Gatto et al. | 358/498 |
| 6,168,077 B1 | * | 1/2001 | Gray et al. | |
| 6,234,844 B1 | * | 5/2001 | Somerville et al. | 439/630 |
| 6,334,575 B1 | * | 1/2002 | Su-Hui | 1/200 |
| 6,343,364 B1 | * | 1/2002 | Leydier et al. | 713/500 |

FOREIGN PATENT DOCUMENTS

WO    WO00/70533    * 11/2000

* cited by examiner

Primary Examiner—Thien M. Le

(57) ABSTRACT

An improved card reader structure with an axial-rotate joint is mainly comprised of a body assembled by an upper and a lower shell disposed therein with a converting circuit mounted by a insertion slot projecting from the longitudinal side of the body and connecting to an USB plug mounted on an axle housing housed to the opening at the front end of the body to enable the card reader to be plugged into the computer main board to eliminate the trouble of using the connecting cable and to provide the possibilities of replacing different flash cards due to the design of the insertion slot and of permitting the body to do axle-rotation in different angles so as to increase the practical value of the product.

5 Claims, 3 Drawing Sheets

CARD READER STRUCTURE WITH AN AXIAL-ROTATE JOINT

BACKGROUND OF THE INVENTION

1) FIELD OF THE INVENTION

The invention herein relates to an improved card reader structure with an axial-rotate joint, more especially, a structure free from the trouble of using a connecting cable but capable of replacing different flash cards and also permitting the body to rotate in different angles to make the card reader more convenient and adaptable in use.

2) DESCRIPTION OF THE PRIOR ART

The common and present card reader, as shown in FIG. 1, usually consists of a main board (11) mounted with an insertion slot (12) and connected to an USB plug (14) via a cable (13) to plug the USB plug (14) into the computer main board with the flash memory card (15) being inserted into the insertion slot (12). The use of the cable (13) for connecting makes this kind of structure quite inconvenient in field application. Therefore, some of the manufacturers developed an attachable flash memory storage device, as shown in FIG. 2. The device is designed with built-in flash memory in its body (21) with an USB plug (22) mounted on one end. Although the volume has been reduced significantly and the trouble of using the connecting cable has been eliminated, the flexibility has been sacrificed. Since the memory has been built-in, it is not replaceable or expandable. The shortcomings associated with both designs have been criticized by and have troubled consumers for a long time. Therefore, whether an improved card reader structure capable of increasing the substantial efficiency and enhancing the practical value of that product to be provided has became a specific need and the motive of the innovation of the invention herein.

SUMMARY OF THE INVENTION

Therefore, the primary objective of the invention herein is to provide an improved card reader structure with an axial-rotate joint comprised of a body assembled by an upper and a lower shells disposed therein with a converting circuit connected with an insertion slot and an USB plug to make the insertion slot and the USB plug project respectively from one of the longitudinal sides and the front end of the body to eliminate the trouble of using the connecting cable but to be directly plugged into the USB receptacles provided by the computer so as to improve the shortcoming of becoming tangled by the cable of the conventional card reader.

Another objective of the invention herein is to achieve the purpose of being capable of replacing the memory thus enhancing the cost efficiency of the card reader by providing an insertion slot mounted on one side of the body to be inserted by different flash memory cards.

To enable a further understanding of the features and the innovation of the invention herein, a brief description of the drawings below is followed by a detailed description of the preferred embodiment.

DETAILED DESCRIPTION OF THE PREFERRED EMBODIMENTS

Figure 1:
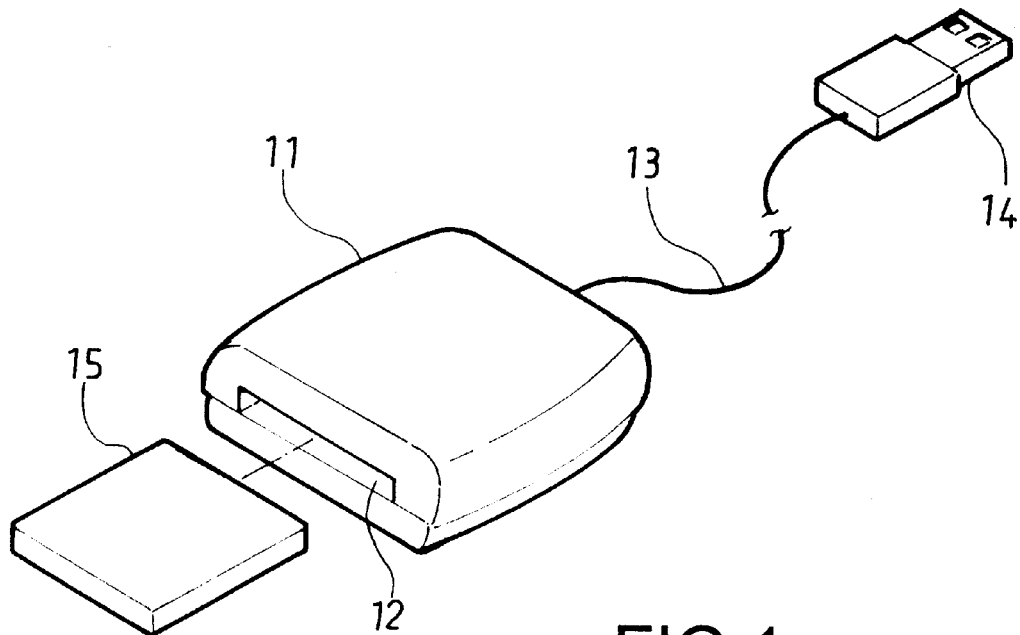
FIG. 1 is a pictorial isometric drawing of the conventional card reader.
Figure 2:
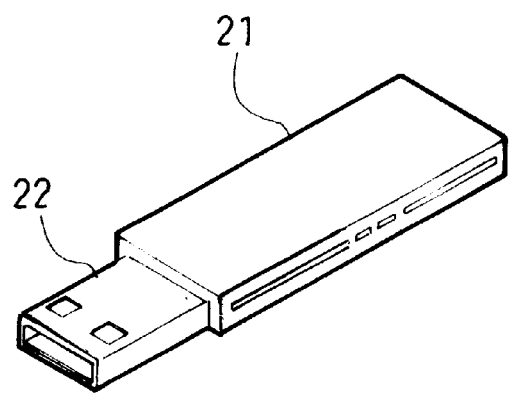
FIG. 2 is a pictorial isometric drawing of another existing attachable flash memory storage device.
Figure 3:
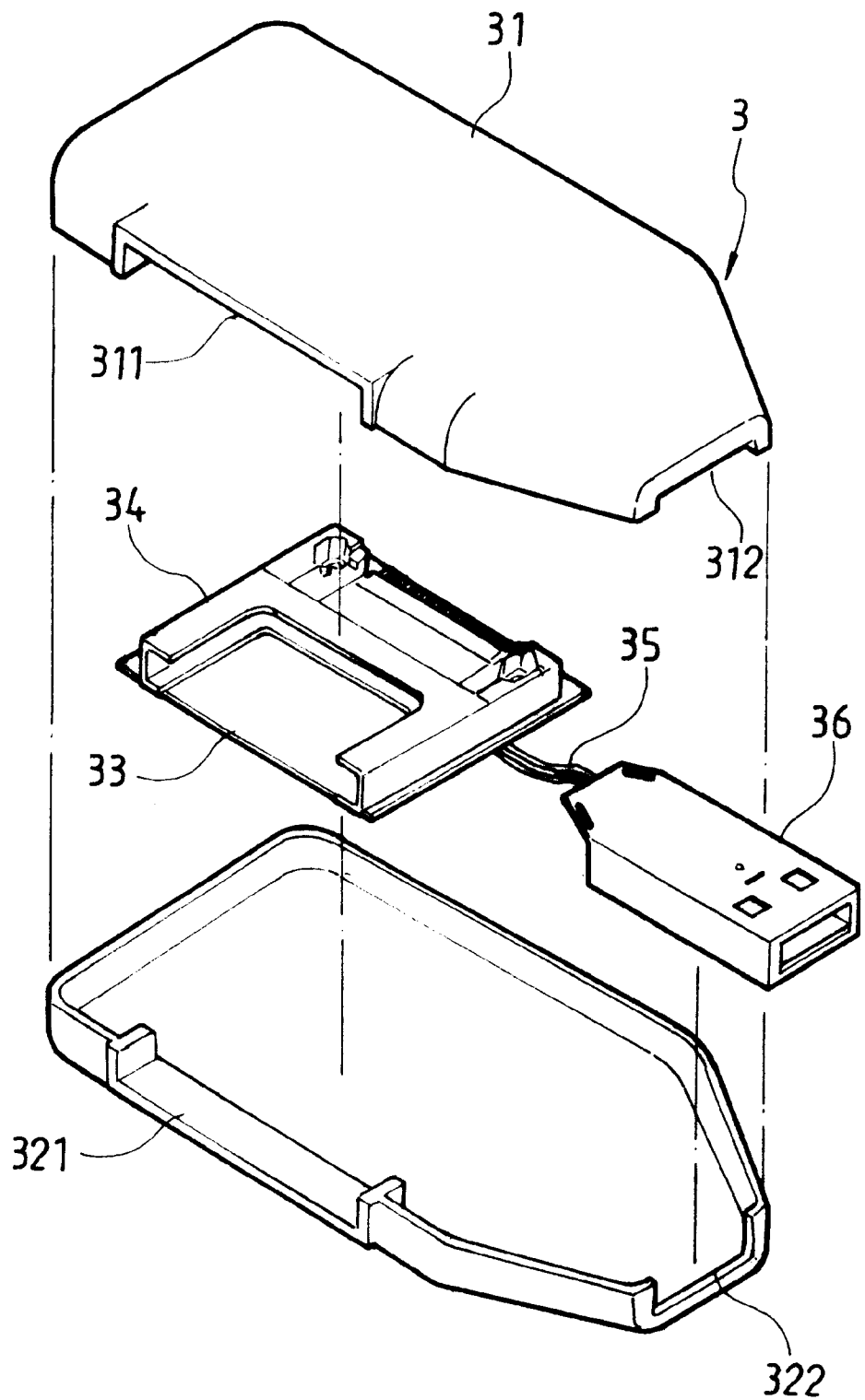
FIG. 3 is a pictorial and exploded isometric drawing of the invention herein.

Referring to FIG. 3 of the pictorial and exploded isometric drawing of the invention herein, the invention herein mainly is mainly comprised of a slender body (3) assembled by an upper and a lower shells (31, 32) with a convergent front end, and a converting circuit (33) disposed inside the body (3) and mounted with an insertion slot (34) to be connected to an USB plug (36) via wires (35); the plug (36) is housed to a circular axle housing (37) with ring flanges in larger diameters on two ends; a stop rib (38) is mounted on the inner flange of the axle housing (37) and the converting circuit (33) is fastened or locked inside the body (3). Since on the upper and the lower shells (31, 32), the symmetrical C-shaped notches (311, 321) are mounted on one of the longitudinal sides and the symmetrical semi-circular notches (312, 322) are mounted on the convergent front ends, after the converting circuit (33) is locked and the upper and lower shells (31, 32) are cased to each other, the insertion slot (34) is positioned right at the two notches (311, 321) and projecting to be inserted by different flash memory cards and USB plug (36) will be enclosed between the two notches (312, 322) by the axle housing (37) to project outwards and to rotate along with the body to compose the positioning function by the stop rib (38) and the convex block (323) disposed on the side of the notch (322) so as to be plugged into the USB receptacle provided on the computer, therefore, the entire card reader (300) can be plugged directly into the receptacle provided on the computer not only eliminating the use of a cable but also making it capable of replacing different flash memory cards.

Figure 4:
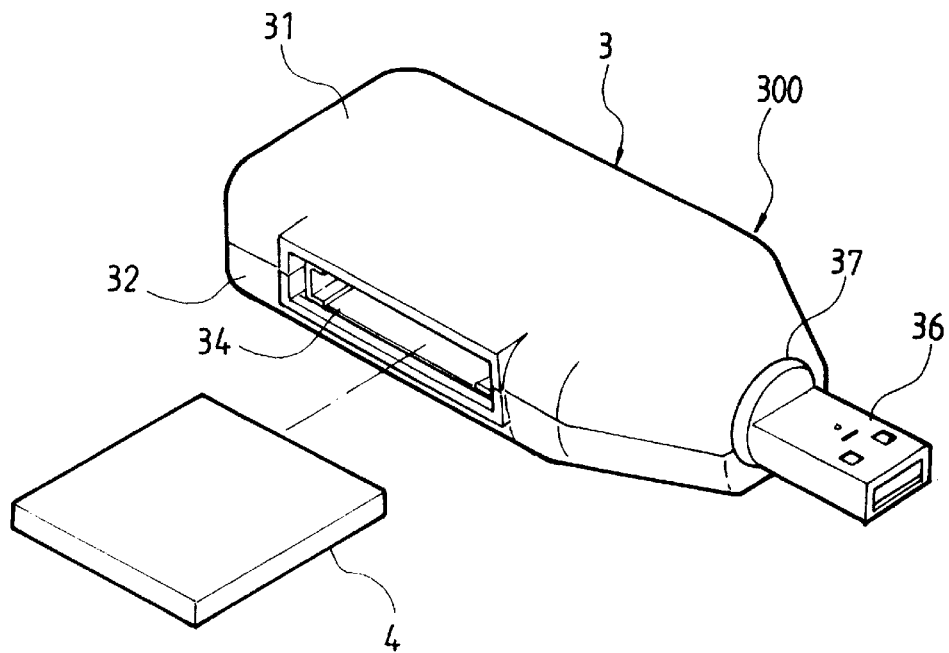
FIG. 4 is a pictorial and isometric drawing of the invention herein.
Figure 5:
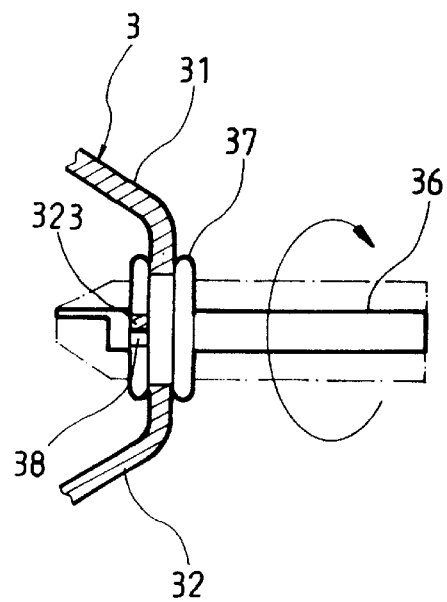
FIG. 5 is an isometric drawing of the movement of the axle housing of the invention herein.

Referring to FIG. 4 of the pictorial isometric drawing of the invention herein, after being assembled, the invention herein is constructed into a card reader (300) in a small volume and is directly plugged into the USB receptacle provided on a computer through the USB plug (36) located on the front end without the need of a cable; furthermore, the insertion slot (34) mounted on the longitudinal side allows the replacement of different flash cards (4) at any time and the body can rotate in different angles at will for adapting various space limitation thus increases the practical value of the card reader (300). Referring to FIG. 5 of the isometric drawing of the movement of the axle housing, the axle housing (37) of the invention herein can rotate freely to permit the connecting body (1) to be turned over to make the memory card and the plug (36) stay in different angles so as to adapt various spaces for plugging.

In summary of the foregoing sections, the improved card reader structure of the invention herein with an insertion slot mounted inside of the body for the flash memory cards to be inserted and with an USB plug to be plugged to the computer main board to eliminated the trouble of connecting via a cable, and the capability of accepting different flash memory cards, is a design of practical use and indeed an innovative invention. The invention fully complies with all new patent application requirements and is hereby submitted to the patent bureau for review and the granting of the commensurate patent rights.

What is claimed is:

1. An improved card reader structure with an axle-rotate joint, is mainly comprised of a body assembled by an upper and a lower shells disposed therein with a converting circuit mounted with an insertion slot and connected to an USB plug through the converting circuit to make the insertion slot project from the front end of the body and the USB plug inserted to a circular axle housing housed at the front end of the body for being directly plugged to the computer main board to eliminate the trouble of using of the connecting cables and to replace different flash memory cards.

2. As mentioned in claim 1 of an improved card reader structure with an axle-rotate joint, wherein, one of the longitudinal sides of the upper and the lower shells are mounted with respective C-shaped notches to make the insertion slot project.

3. As mentioned in claim 1 of an improved card reader structure with an axle-rotate joint, wherein, the front ends of the upper and the lower shells are mounted with respective semi-circular notches; the two ends of the axle housing inserted with the plug are mounted with flanges in larger diameters to enable the axle housing to rotate after being inserted at the notches.

4. As mentioned in claim 1 of an improved card reader structure with an axle-rotate joint, wherein, the stop rib and convex rib are mounted respectively on one side of the notch on the lower shell and the inner flange of the axle housing for composing the positioning in rotation.

5. As mentioned in claim 1 of an improved card reader structure with an axle-rotate joint, wherein, the flash memory card inserted in the insertion slot and the USB plug stay proximately in a 90-degree angle.

* * * * *